(12) United States Patent
Shi et al.

(10) Patent No.: US 11,626,547 B2
(45) Date of Patent: Apr. 11, 2023

(54) UV LED DEVICE

(71) Applicant: XIAMAN SANAN OPTOELECTRONICS TECHNOLOGY CO., LTD., Xiamen (CN)

(72) Inventors: Junpeng Shi, Xiamen (CN); Weng-Tack Wong, Xiamen (CN); Qiuxia Lin, Xiamen (CN); Xinglong Li, Xiamen (CN)

(73) Assignee: XIAMEN SANAN OPTOELECTRONICS TECHNOLOGY, CO., LTD., Xiamen (CN)

( * ) Notice: Subject to any disclaimer, the term of this patent is extended or adjusted under 35 U.S.C. 154(b) by 224 days.

(21) Appl. No.: 17/111,173

(22) Filed: Dec. 3, 2020

(65) Prior Publication Data
US 2021/0091277 A1   Mar. 25, 2021

Related U.S. Application Data

(63) Continuation-in-part of application No. 16/761,915, filed as application No. PCT/CN2018/113516 on Nov. 1, 2018, now abandoned.

(30) Foreign Application Priority Data

Nov. 8, 2017 (CN) .......................... 201711092487.0
Nov. 8, 2017 (CN) .......................... 201721480082.X

(51) Int. Cl.
*H01L 33/58* (2010.01)
*H01L 33/56* (2010.01)

(52) U.S. Cl.
CPC .............. *H01L 33/58* (2013.01); *H01L 33/56* (2013.01)

(58) Field of Classification Search
CPC ................................ H01L 33/58; H01L 33/56
See application file for complete search history.

(56) References Cited

U.S. PATENT DOCUMENTS

| 2016/0118552 A1 | 4/2016 | Kim | |
| 2017/0263833 A1* | 9/2017 | Chiu | ....................... H01L 33/62 |
| 2020/0192003 A1* | 6/2020 | Kikuchi | ................. H01L 33/56 |

FOREIGN PATENT DOCUMENTS

| CN | 105845814 A | 8/2016 |
| CN | 106784243 A | 5/2017 |

(Continued)

OTHER PUBLICATIONS

Bowl, (n.d.) Collins English Dictionary—Complete and Unabridged, 12th Edition 2014. (1991, 1994, 1998, 2000, 2003, 2006, 2007, 2009, 2011, 2014). Retrieved Sep. 8, 2022 from https://www.thefreedictionary.com/bowl (Year: 2014).*

(Continued)

*Primary Examiner* — Jay C Chang
*Assistant Examiner* — Mikka Liu
(74) *Attorney, Agent, or Firm* — Thomas | Horstemeyer, LLP

(57) ABSTRACT

A UV LED device includes a base, a lens disposed on the base, an adhesive unit, an LED chip unit, and an encapsulating member. The adhesive unit has multiple layers and is connected between the base and the lens such that the base, the lens and the adhesive unit cooperatively define an enclosed space. The LED chip unit is disposed in the enclosed space. The encapsulating member is disposed in the enclosed space, and encapsulates the LED chip unit. The encapsulating member is made of a material the same as a material of at least one layer of the adhesive unit.

20 Claims, 12 Drawing Sheets

(56) References Cited

FOREIGN PATENT DOCUMENTS

| | | |
|---|---|---|
| CN | 106848031 A | 6/2017 |
| CN | 207425908 U | 5/2018 |
| CN | 108134007 A | 6/2018 |
| JP | 2011197028 A | 10/2011 |

OTHER PUBLICATIONS

International Search Report for PCT/CN2018/113516 dated Jan. 11, 2019.

\* cited by examiner

UV LED DEVICE

CROSS-REFERENCE TO RELATED APPLICATION

This application is a continuation-in-part application of U.S. 371 National Phase application Ser. No. 16/761,915 filed on May 6, 2020, which claims priority of PCT International Application No. PCT/CN201B/113516 filed on Nov. 1, 2018, which claims priority of Chinese Patent Application Nos. 201711092487.0 and 201721-180082.X. The entire content of each of the international and Chinese patent applications is incorporated herein by reference.

FIELD

The disclosure relates to a semiconductor device, and more particularly to an ultraviolet (UV) light emitting diode (LED) device.

BACKGROUND

Conventional UV LED devices are widely used in various applications such as sterilization, backlight, UV printing, medical industry, food and beverage industry, plant growing, etc. due to their extended life span, and energy efficiency. However, conventional UV LED devices often suffer from low light efficiency due to internal reflection. Moreover, it is desirable to improve adhesion between the lens and substrate used in the conventional UV LED devices so as to enhance the reliability of such devices.

SUMMARY

Therefore, an aspect of the present disclosure is to provide a UV LED device that can alleviates at least one of the drawbacks of the prior art.

The UV LSD device includes a base, a lens, an adhesive unit, an LED chip unit and an encapsulating member. The lens is disposed on the base. The adhesive unit has multiple layers and is connected between the base and the lens such that the base, the lens and the adhesive unit cooperatively define an enclosed space. The LED chip unit is disposed in the enclosed space. The encapsulating member is disposed in the enclosed space, and encloses the LED chip unit. The encapsulating member is made of a material the same as a material of at least one layer of the adhesive unit.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
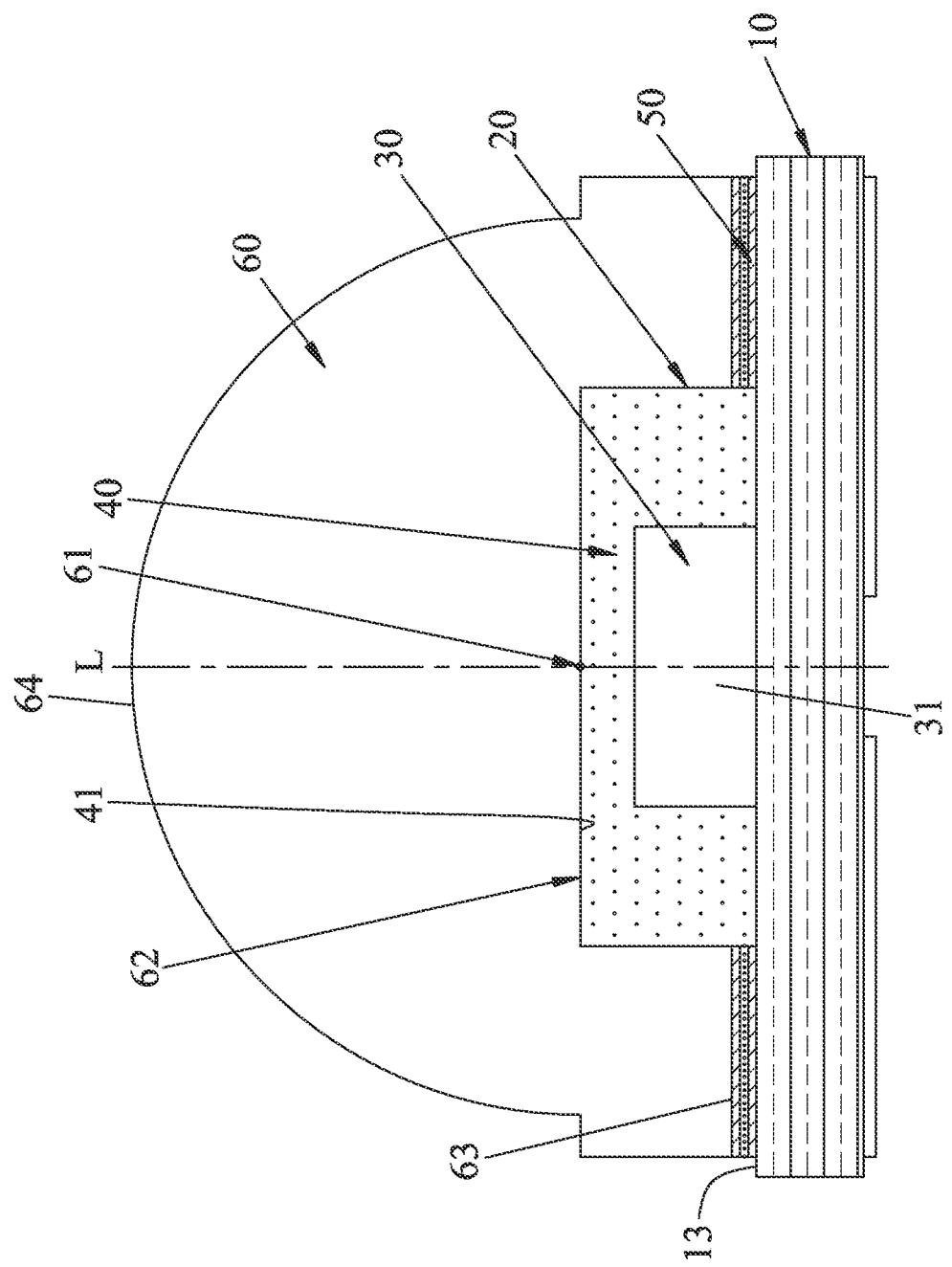
FIG. 1 is a schematic view of a first embodiment of a UV LED device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
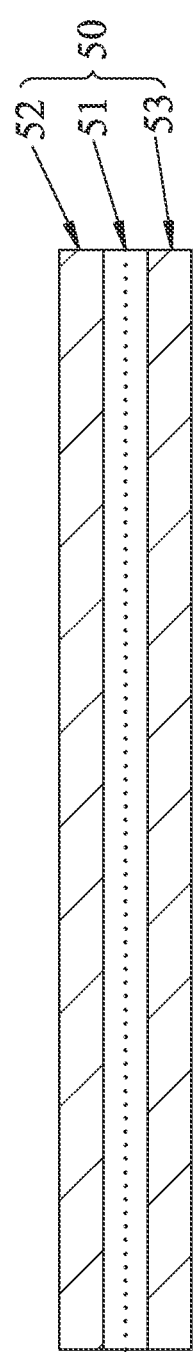
FIG. 2 is a schematic view of an adhesive unit, of the first embodiment.

Referring to FIGS. 1 and 2, a first embodiment of a UV LED device according to the present disclosure includes a base 10, an LED chip unit 30, an encapsulating member 40, an adhesive unit 50 having multiple layers, and a lens 60. The lens 60 is disposed on the base 10 and is connected to the base 10 via the adhesive unit 50. The base 10, the lens 60 and the adhesive unit 50 cooperatively define an enclosed space 20. The LED chip unit 30 is disposed on the base 10 and in the enclosed space 20. The encapsulating member 40 is disposed in the enclosed space 20 and encapsulates the LED chip unit 30. The encapsulating member 40 is made of a material the same as a material of at least one layer of the adhesive unit 50. With the encapsulating member 40 encapsulating the LED chip unit 30, the internal reflection issue associated with an air-LED chip interface may be alleviated.

The base 10 may be made of an electrically insulating material, such as ceramic material, which includes low temperature co-fired ceramic, high temperature co-fired ceramic, etc. Alternatively, the base 10 may be made of aluminum nitride, or other metal nitrides that have a thermal conductivity of at least 140 W/(m·K).

The LED chip unit 30 includes at least one ultraviolet LED chip 31 having an emission wavelength ranging from 200 nm to 330 nm. Specifically, the ultraviolet LED chip 31 may have an emission wavelength range of one of 315 nm to 390 nm (i.e., long wave (UV-A)), 280 nm to 315 nm (i.e., medium wave (UV-B)), and 200 nm to 280 nm (i.e., short wave (UV-C)). The emission wavelength range of the ultraviolet LED chip 31 can be changed according to practical applications, such as surface germicidal irradiation, surface curing, etc. According to practical requirements, the LED chip unit 30 may include multiple LED chips with different emission wavelength ranges, and the number and type of the LED chips may be changed.

The material of the encapsulating member 40 is selected from the group consisting of a fluorine-containing compound, a silicon-fluorine bond-containing compound, a carbon-fluorine bond-containing compound, a silicon-oxygen bond-containing compound, a carbon-carbon bond-containing compound, a methyl group-containing compound, a phenyl group-containing compound, and combinations thereof. In this embodiment, the material of the encapsulating member 40 is the fluorine-containing compound, such as fluororesin. Alternatively, the encapsulating member 40 may be made of silicone, such as silicon in liquid state that contains water and that would not solidify when exposed to high temperature and ultraviolet light. The encapsulating member 40 may have a refractive index ranging from 1.3 to 1.6, and may have a light transmittance greater than 80% for a light having a wavelength that, ranges from 260 nm to 320 nm.

The lens 60 may have a light transmittance greater than 80% for a light, having a wavelength that, ranges from 260 nm to 320 nm. The lens 60 has a bottom surface 63 that is connected to the adhesive unit 50, and that is indented to form a recess 62 which constitutes the enclosed space 20. The lens 60 further has an upper arc surface 64 that is a part of an imaginary circle, and a center of sphere 61 that is located above the recess 62. Specifically, the base 10 has a top surface 13 that is connected to the adhesive unit 50, and the center of sphere 61 of the lens 60 is located on a normal line (L) that extends through a center of the top surface 13 of the base 10 and is located on an upper surface 41 of the encapsulating member 40 that is connected to the encapsulating member 40.

The adhesive unit 50 has a first layer 51, a second layer 52 that is connected between the first layer 51 and the bottom surface 63 of the lens 60, and a third layer 53 that is connected between the first layer 51 and the top surface 13 of the base 10. In this embodiment, the first layer 51 is the at least one layer made of the material the same as that of the encapsulating member 40, and the encapsulating member 40 and the first layer 51 of the adhesive unit 50 are integrally formed as a single piece. An adhesive force between the second layer 52 and the lens 60 is not less than 2 MPa, and an adhesive force between the third layer 53 and the base 10 is not less than 2 MPa. The first layer 51 has a thickness not greater than 5 μm. Each of the second layer 52 and the third layer 53 includes a silicone unit and has a plurality of polar terminal groups. The first layer 51 of the adhesive unit 50 may be a liquid silicone that contains water and that would not solidify when exposed to high temperature and ultraviolet light. The second layer 52 and the third layer 53 serve as primer layers for enhancing bonding of the lens 60 to the base 10.

Figure 3:
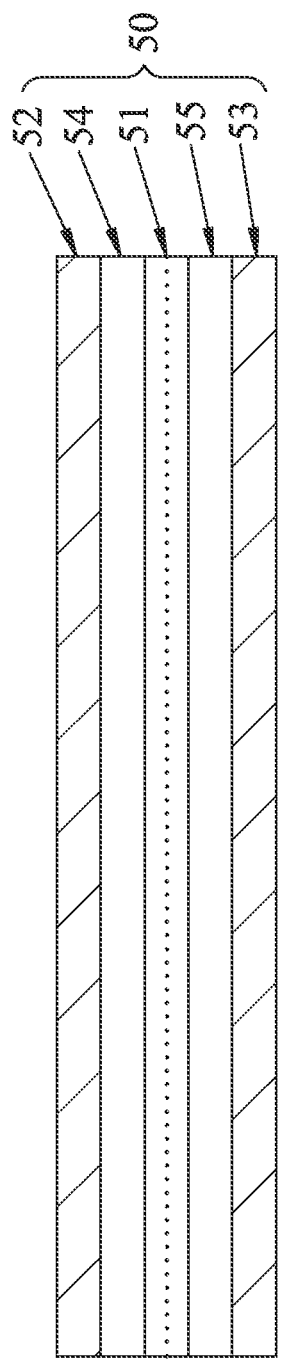
FIG. 3 is a schematic view of a variation of the adhesive unit of the first embodiment.

Referring further to FIG. 3, a variation of the adhesive unit 50 further has a fourth layer 54 that is connected between the first layer 51 and the second layer 52 for enhancing bonding between the first and second layers 51, 52, and a fifth layer 55 that is connected between the first layer 51 and the third layer 53 for enhancing bonding between the first and third layers 51, 53. Each of the fourth layer 54 and the fifth layer 55 includes one of a fluororesin and a lipid-containing compound. Each of the fluororesin and the lipid-containing compound includes a terminal group selected from the group consisting of a carboxyl group, a hydrogen group, an unsaturated bond, and combinations thereof. An example of the material for forming the fourth and fifth layers 54, 55 is SP-120 that is commercially available from Nusil Technology LLC. The abovementioned materials for the fourth and fifth layers 54, 55 may also be used for forming the second and third layers 52, 53.

Figure 4:
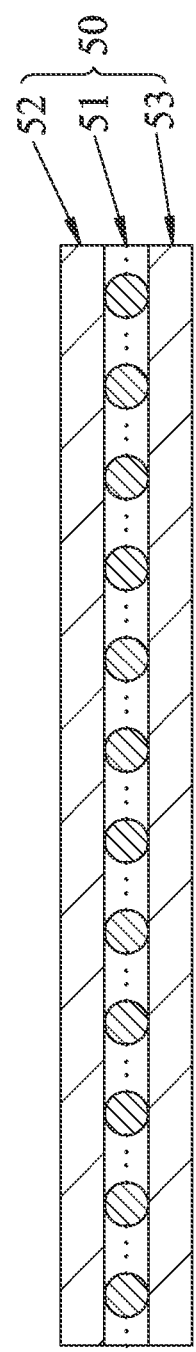
FIG. 4 is a schematic view of another variation of the adhesive unit of the first embodiment.

Referring to FIG. 4, another variation of the first layer 51 of the adhesive unit 50 is a discontinuous layer.

The UV LED device of this disclosure contains a simplified structure including the lens 60 formed with the recess 62 for receiving the encapsulating member 40. Compared to conventional UV LED devices, the UV LED device of this disclosure has a light efficiency which is improved by 30%. In addition, the adhesive unit 50 provides superior adhesion and sealing to the UV LED device, thereby improving the reliability of the UV LED device.

Figure 5:
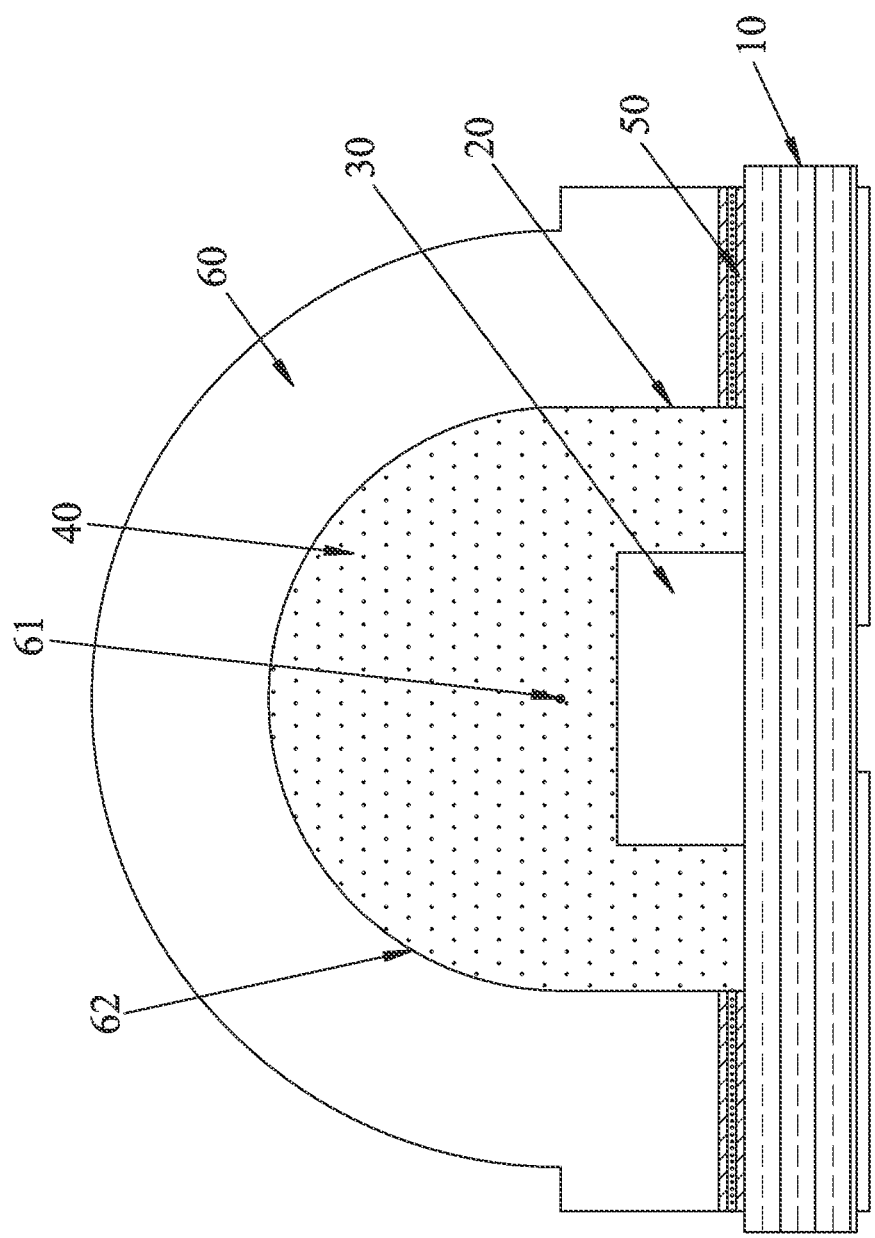
FIGS. 5 to 12 are schematic views of second to ninth embodiments of the UV LED device according to the present disclosure.

Referring to FIG. 5, a second embodiment of the UV LED device according to the present disclosure has a structure similar to that of the first embodiment, with differences described hereinafter. In the second embodiment, a top portion of the recess 62 is semi-circle-shaped, which further improves the light efficiency of the UV LED device. In addition, the center of sphere 61 of the lens 60 is located in the enclosed space 20 (i.e., located in the encapsulating member 40).

Figure 6:
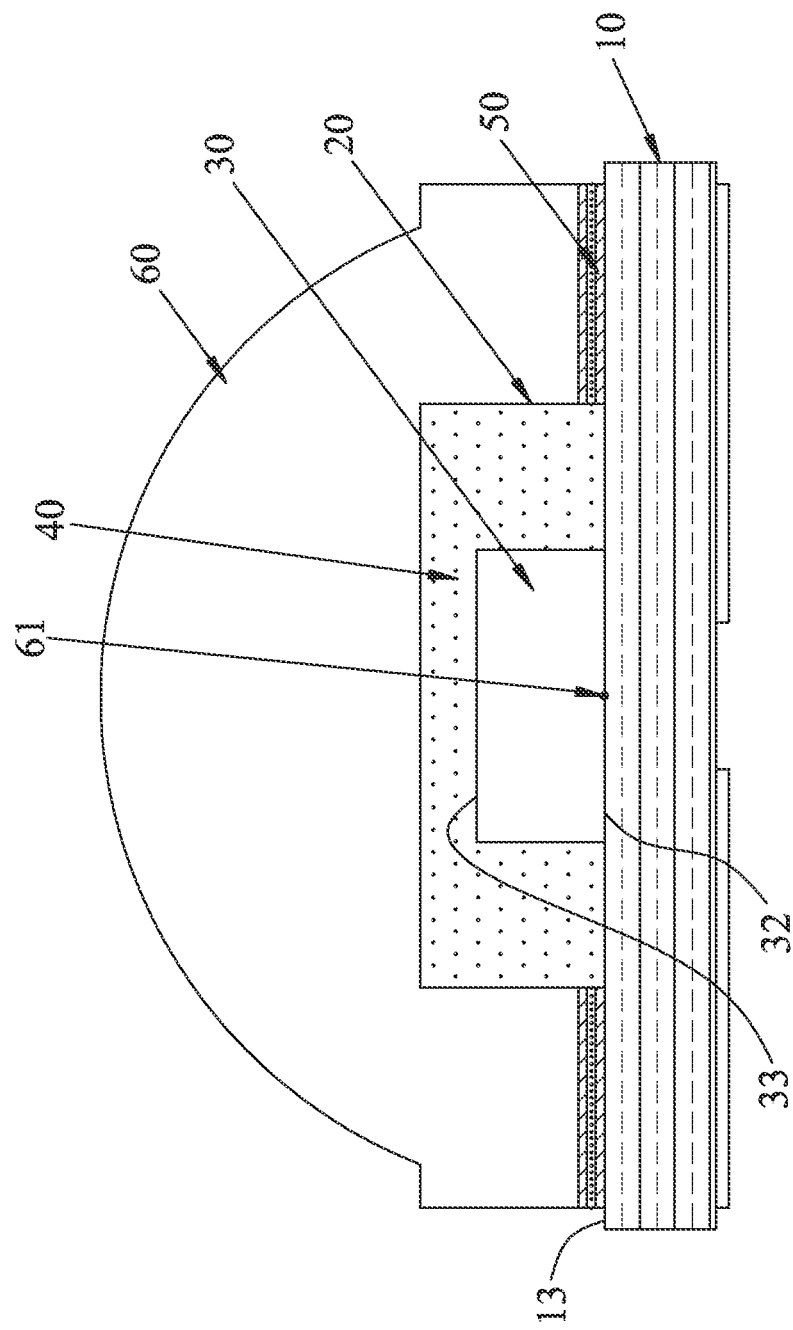

Referring to FIG. 6, a third embodiment of the UV LED device according to the present disclosure has a structure similar to that of the first embodiment, with differences described hereinafter. In the third embodiment, the center of sphere 61 of the lens 60 is located below the enclosed space 20. Specifically, the LED chip unit 30 has a bottom surface 32 that is connected to the top surface 13 of the base 10, and a top surface 33 that is opposite to the bottom surface 32. The center of sphere 61 of the lens 60 is located at the bottom surface 32 of the LED chip unit 30.

Figure 7:
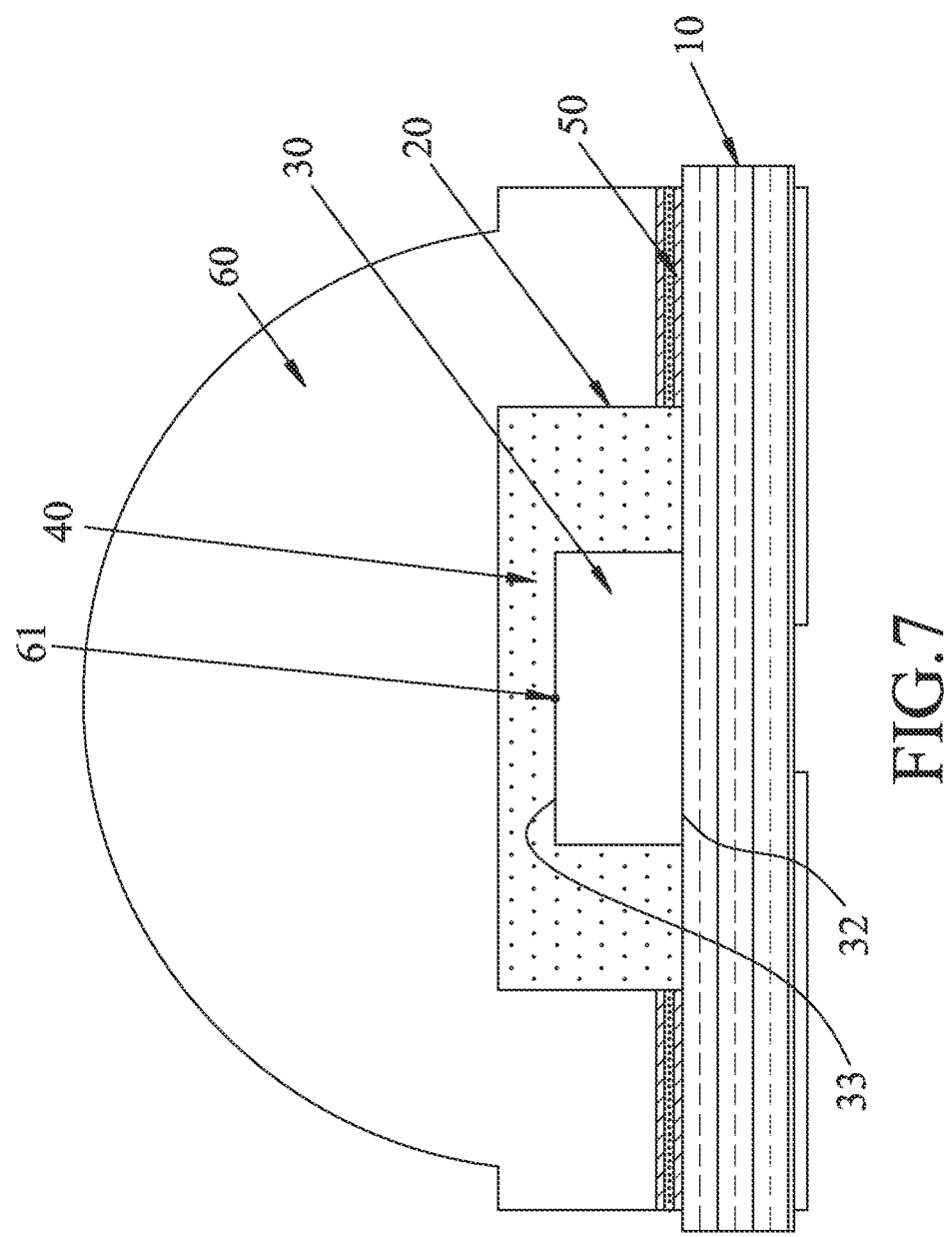

Referring to FIG. 7, a fourth embodiment of the UV LED device according to the present disclosure has a structure similar to that of the third embodiment, with differences described hereinafter. In the fourth embodiment, the center of sphere 61 of the lens 60 is located on the top surface 33 of the LED chip unit 30.

Figure 8:
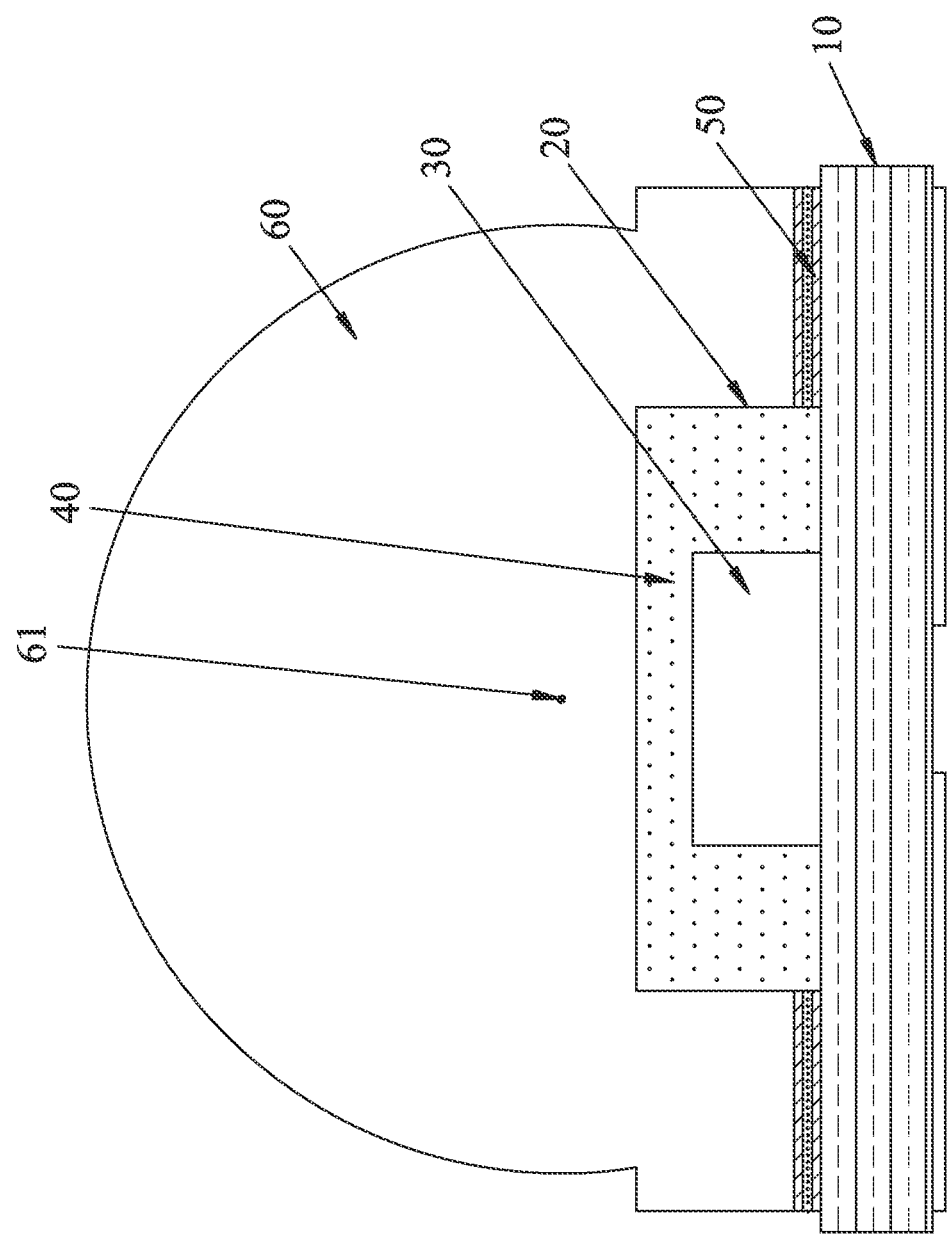

Referring to FIG. 8, a fifth embodiment of the UV LED device according to the present disclosure has a structure similar to that of the first embodiment, with differences described hereinafter. In the fifth embodiment, the center of sphere 61 of the lens 60 is located in the lens 60 and above the encapsulating member 40.

The location of the center of sphere 61 of the lens 60 may be adjusted according to practical requirements. It should be noted that although the locations of the center of sphere 61 of the lens 60 are different in the first to fifth embodiments, the light angles of the UV LED devices of the first to fifth embodiments may be controlled to be substantially the same. A UV LED device with the center of sphere 61 at a lower location may be chosen when there is lesser space for mounting the UV LED device. When sufficient space is available for mounting the UV LED device, a UV LED device with the center of sphere 61 at a higher location may be chosen for providing enhanced brightness. In certain embodiments, the center of sphere 61 of the lens 60 may be located at interior of the LED chip unit 30.

Figure 9:
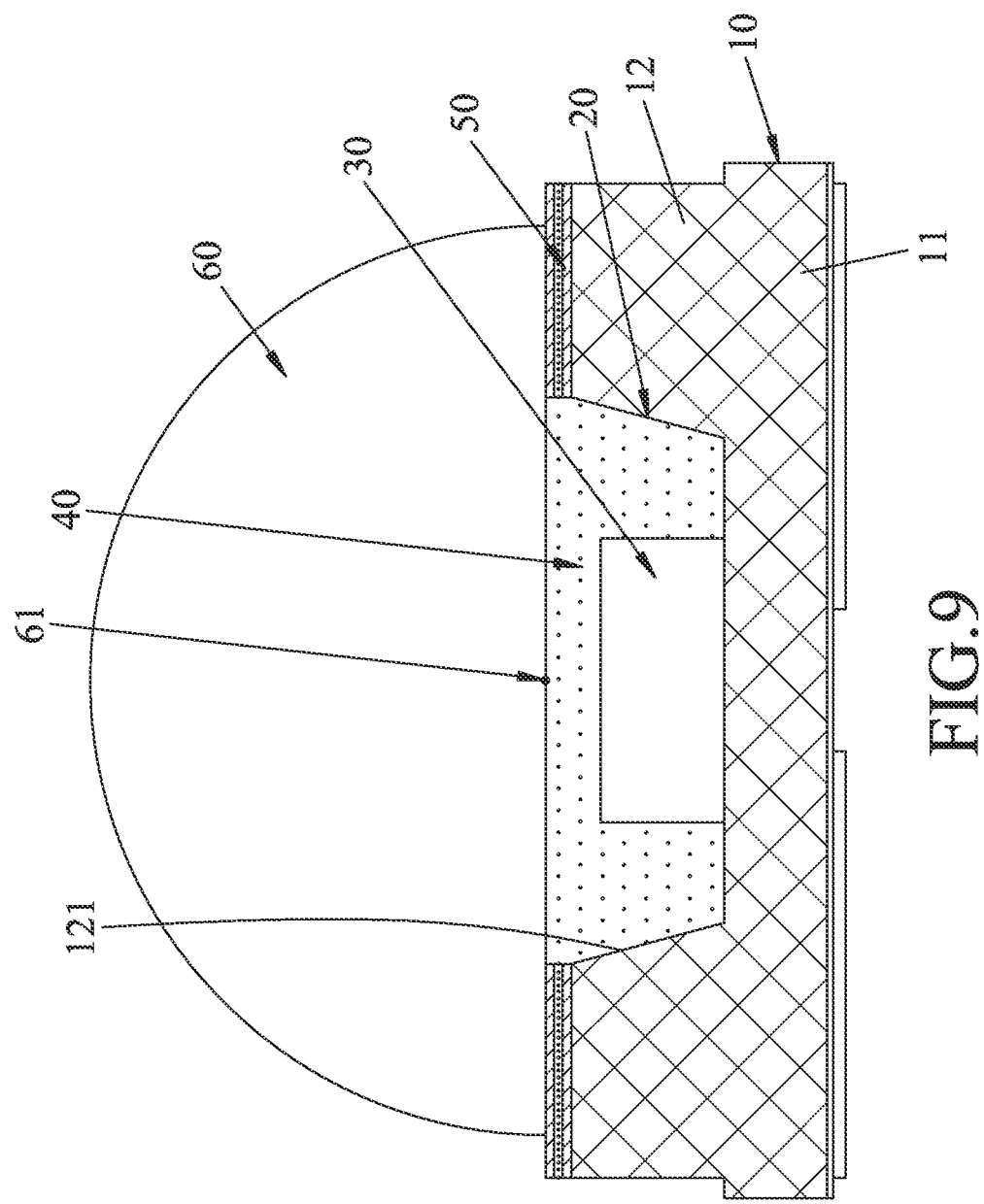

Referring to FIG. 9, a sixth embodiment of the UV LED device according to the present disclosure has a structure similar to that of the first embodiment, with differences described hereinafter. In the sixth embodiment, the base 10 is bowl-shaped, and has a base portion 11 carrying the LED chip unit 30, and a surrounding portion 12 surrounding the LED chip unit 30 and the encapsulating member 40. The base 10 may be formed by a punch process such that the base portion 11 and the surrounding portion 12 are integrally formed as a single piece. An interior surface 121 of the surrounding portion 12 may be inclined toward the base portion 11 for reflecting light emitted by the LED chip unit 30 to improve light efficiency of the UV LED device.

Figure 10:
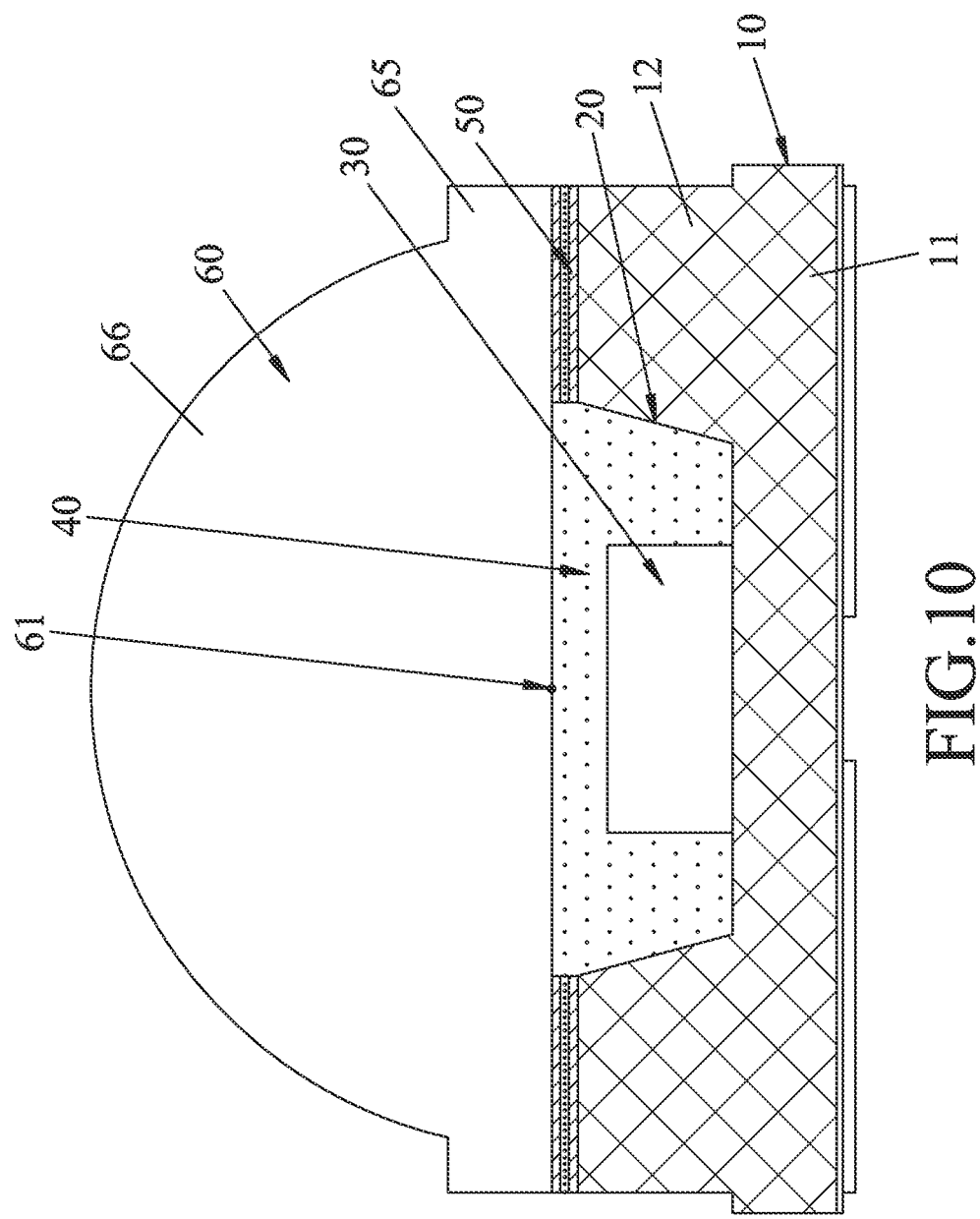

Referring to FIG. 10, a seventh embodiment of the UV LED device according to the present disclosure has a structure similar to that of the sixth embodiment, with differences described hereinafter. In the seventh embodiment, the lens 60 has a bottom flat portion 65 and a top arc portion 66. The center of sphere 61 of the lens 60 is located at a bottom surface of the bottom flat portion 65. It should be noted that, in making the UV LED device, a suction tube may pick up the lens 60 at the bottom surface of the bottom flat portion 65, which improves stability during pick up and improves the overall yield of the thus manufactured UV LED device.

Figure 11:
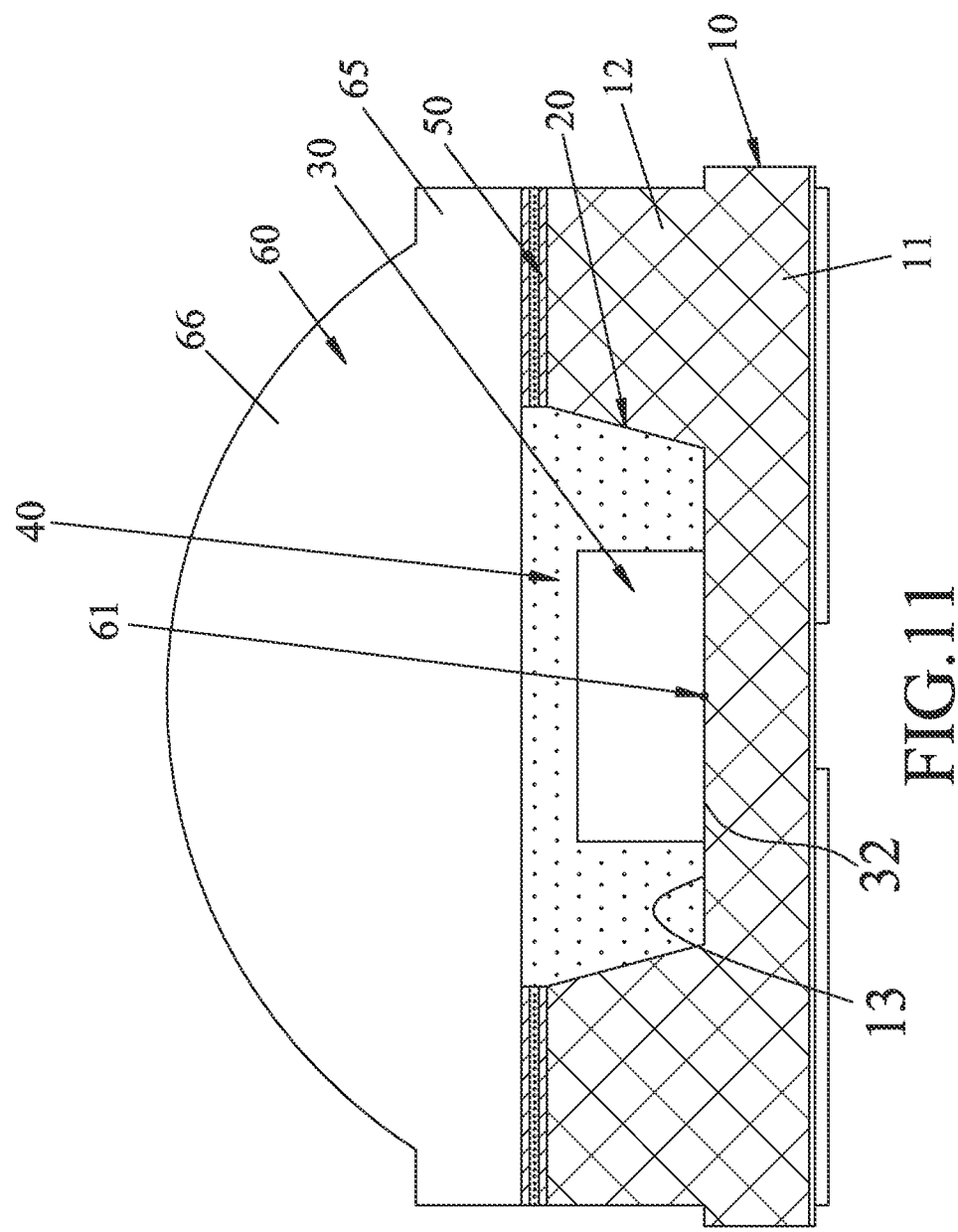

Referring to FIG. 11, an eighth embodiment of the UV LED device according to the present disclosure has a structure similar to that of the seventh embodiment, with differences described hereinafter. In the eighth embodiment, the center of sphere 61 of the lens 60 is located on the top surface 13 of the base 10 and on the bottom surface 32 of the LED chip unit 30.

Figure 12:
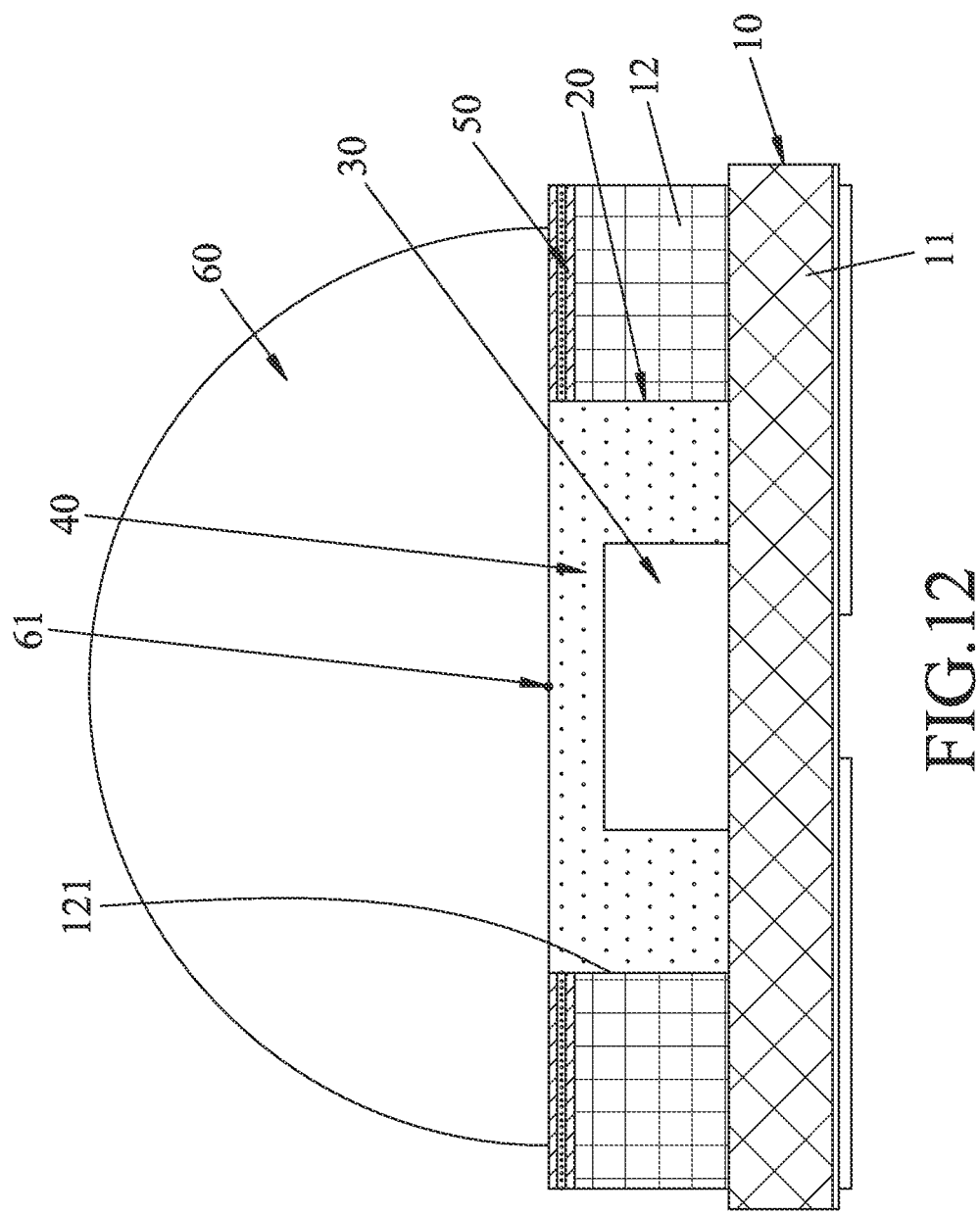

Referring to FIG. 12, a ninth embodiment of the UV LED device according to the present disclosure has a structure similar to that of the sixth embodiment, with differences described hereinafter. In the ninth embodiment, the base portion 11 and the surrounding portion 12 of the base 10 are separately manufactured. The inclined angle of the interior surface 121 of the surrounding portion 12 may be adjusted according to practical requirements, and may be coated with a high reflection coating (not shown) to further improve light efficiency of the UV LED device.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with, one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. An ultraviolet (UV) light emitting diode (LED) device comprising:
   a base;
   a lens disposed on said base;
   an adhesive unit having multiple layers and being connected between said base and said lens such that said base, said lens and said adhesive unit cooperatively define an enclosed space;
   an LED chip unit disposed in said enclosed space; and
   an encapsulating member disposed in said enclosed space and encapsulating said LED chip unit, said encapsulating member being made of a material the same as a material of at least one layer of said adhesive unit;
   wherein:
   the material of said encapsulating member is selected from the group consisting of a fluorine-containing compound, a silicon-fluorine bond-containing compound, a carbon-fluorine bond-containing compound, a silicon-oxygen bond-containing compound, a carbon-carbon bond-containing compound, a methyl group-containing compound, a phenyl group-containing compound, and combinations thereof;
   said multiple layers of said adhesive unit has a first layer, a second layer that is connected between said first layer and said lens, and a third layer that is connected between said first layer and said base;
   said first layer is said at least one layer made of the material the same as that of said encapsulating member; and
   each of said second layer and said third layer includes a silicone unit and has a plurality of polar terminal groups.

2. The UV LED device as claimed in claim 1, wherein said encapsulating member and said at least one layer of said adhesive unit are integrally formed as a single piece.

3. The UV LED device as claimed in claim 1, wherein said at least one layer of said adhesive unit is a discontinuous layer.

4. The UV LED device as claimed in claim 1, wherein said encapsulating member is made of one of silicone and fluororesin.

5. The UV LED device as claimed in claim 1, wherein:
   said multiple layers of said adhesive unit further has a fourth layer that is connected between said first layer and said second layer, and a fifth layer that is connected between said first layer and said third layer; and
   each of said fourth layer and said fifth layer includes one of a fluororesin and a lipid-containing compound, each of the fluororesin and the lipid-containing compound including a terminal group selected from the group consisting of a carboxyl group, a hydrogen group, an unsaturated bond, and combinations thereof.

6. The UV LED device as claimed in claim 1, wherein an adhesive force between said second layer and said lens is not less than 2 MPa, and an adhesive force between said third layer and said base is not less than 2 MPa.

7. The UV LED device as claimed in claim 6, wherein said first layer has a thickness not greater than 5 μm.

8. The UV LED device as claimed in claim 1, wherein said encapsulating member is in liquid state.

9. The UV LED device as claimed in claim 1, wherein said encapsulating member has a refractive index ranging from 1.3 to 1.6.

10. The UV LED device as claimed in claim 1, wherein said encapsulating member has a light transmittance greater than 80% for a light having a wavelength ranging from 260 nm to 320 nm.

11. The UV LED device as claimed in claim 1, wherein said base is bowl-shaped.

12. The UV LED device as claimed in claim 1, wherein said lens has a center of sphere located on a normal line that extends through a center of a top surface of said base, said top surface of said base being connected to said adhesive unit.

13. The UV LED device as claimed in claim 1, wherein said lens has a center of sphere located in said enclosed space.

14. The UV LED device as claimed in claim 1, wherein said lens has a center of sphere located on an upper surface of said encapsulating member that is connected to said lens.

15. The UV LED device as claimed in claim 1, wherein said lens has a center of sphere located at one of a bottom surface of said LED chip unit which is connected to said base, a top surface of said LED chip unit which is opposite to said bottom surface, and interior of said LED chip unit.

16. The UV LED device as claimed in claim 1, wherein said lens has a center of sphere located at one of a bottom surface of said encapsulating member which is connected to said base, a top surface of said encapsulating member which is opposite to said bottom surface, and interior of said encapsulating member.

17. The UV LED device as claimed in claim 1, wherein said lens has a recess that constitutes said enclosed space.

18. The UV LED device as claimed in claim 1, wherein said lens has an upper arc surface that is a part of an imaginary circle.

19. The UV LED device as claimed in claim 1, wherein said lens has a bottom surface that is connected to said adhesive unit and said encapsulating member, and that is a flat surface.

20. The UV LED device as claimed in claim 1, wherein said LED chip unit includes at least one ultraviolet LED chip having an emission wavelength range of one of 200 nm to 380 nm, 315 nm to 380 nm, 280 nm to 315 nm, and 200 nm to 280 nm.

* * * * *